US006680235B1

(12) United States Patent
U'Ren et al.

(10) Patent No.: US 6,680,235 B1
(45) Date of Patent: Jan. 20, 2004

(54) METHOD FOR FABRICATING A SELECTIVE EPTAXIAL HBT EMITTER

(75) Inventors: Greg D. U'Ren, Corona Del Mar, CA (US); Marco Racanelli, Santa Ana, CA (US); Klaus F. Schuegraf, Aliso Viejo, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/302,308

(22) Filed: Nov. 22, 2002

Related U.S. Application Data (62) Division of application No. 10/067,034, filed on Feb. 4, 2002, now Pat. No. 6,617,619.

(51) Int. Cl.[7] .......................................... H01L 21/8222
(52) U.S. Cl. ........................ 438/309; 438/312; 438/321
(58) Field of Search ................................. 438/309, 366, 438/367, 368, 481, 364, 365, 312, 320, 321

(56) References Cited

U.S. PATENT DOCUMENTS

| | | | | |
|---|---|---|---|---|
| 5,773,350 A | * | 6/1998 | Herbert et al. ............. 438/364 |
| 6,251,738 B1 | * | 6/2001 | Huang ......................... 438/312 |
| 6,316,818 B1 | * | 11/2001 | Marty et al. ................. 257/592 |
| 6,337,494 B1 | * | 1/2002 | Ryum et al. ................. 257/197 |
| 6,384,469 B1 | * | 5/2002 | Chantre ....................... 257/565 |
| 6,492,711 B1 | * | 12/2002 | Tagaki et al. ................ 257/593 |

* cited by examiner

Primary Examiner—Tuan H. Nguyen
(74) Attorney, Agent, or Firm—Farjami & Farjami LLP (57) ABSTRACT

According to one exemplary embodiment, a heterojunction bipolar transistor comprises a base having a top surface. The heterojunction bipolar transistor further comprises an epitaxial emitter selectively situated on the top surface of the base. For example, the epitaxial emitter may be N-type single-crystal silicon. The heterojunction bipolar transistor further comprises an etch stop layer situated on the top surface of the base, where the etch stop layer is in contact with the epitaxial emitter. The heterojunction bipolar transistor further comprises a first spacer and a second spacer situated on the etch stop layer, where the epitaxial emitter is situated between the first and second spacer. The first spacer and the second spacer, for example, may be LPCVD silicon nitride. The heterojunction bipolar transistor further comprises a dielectric layer deposited on the first and second spacers. The heterojunction bipolar transistor further comprises an antireflective coating layer deposited over the dielectric layer.

11 Claims, 5 Drawing Sheets

METHOD FOR FABRICATING A SELECTIVE EPTAXIAL HBT EMITTER

This is a divisional of application Ser. No. 10/067,034 filed Feb. 4, 2002, now U.S. Pat. No. 6,617,619.

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

In a silicon-germanium ("SiGe") heterojunction bipolar transistor ("HBT"), a thin silicon-germanium layer is grown as the base of a bipolar transistor on a silicon wafer. The SiGe HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the SiGe HBT.

The higher gain, speed and frequency response of the SiGe HBT are possible due to certain advantages of silicon-germanium, such as a narrower band gap and reduced resistivity. These advantages make silicon-germanium devices more competitive than silicon-only devices in areas of technology where high speed and high frequency response are required.

The advantages of high speed and high frequency response discussed above require, among other things, that parasitic capacitance in the SiGe HBT is minimized. One source of parasitic capacitance associated with the SiGe HBT is emitter to base capacitance. The practical effect of a capacitor is that it stores electrical charges that are later discharged, and the extra time required to charge and discharge the excess capacitance slows down the transistor. Because the benefits of high speed and high frequency response, as well as high gain, can be compromised by such excess capacitance, it is a goal of SiGe HBT design to reduce such excess capacitance to a minimum. For instance, by keeping the emitter to base capacitance low, improved SiGe HBT performance is achieved.

Parasitic emitter to base capacitance in a conventional SiGe HBT is composed of intrinsic and extrinsic components. The intrinsic component of the parasitic emitter to base capacitance is the emitter-base junction capacitance inherent in the SiGe HBT and is determined by various fabrication parameters in the SiGe HBT device. Therefore, the emitter-base junction capacitance can only be reduced by altering the fabrication parameters and performance of the device itself. For example, reduction in emitter-base junction capacitance could be achieved by making the active region width of the SiGe HBT smaller, but such a modification to the device architecture would alter the performance properties of the device.

The extrinsic component of the parasitic emitter to base capacitance in a conventional SiGe HBT results from portions of the polycrystalline silicon emitter that extend beyond the active area of the SiGe HBT. The portions of the conventional polycrystalline silicon emitter that extend beyond the active area are situated above the extrinsic base region of the conventional SiGe HBT, and thus create parasitic emitter to extrinsic base capacitance.

Various methods aimed at reducing the parasitic emitter to base capacitance are known in the art, but these methods have not produced the level of reduction desired or, in other instances, are impractical to implement. For example, one method proposed involves reducing the geometries of the SiGe HBT, particularly reducing the portions of the emitter that extend beyond the width of the active region and overlap extrinsic base regions. Unfortunately, such undesired overlapping can only be reduced to the extent permitted by current photolithography processes utilized to fabricate the emitter. Thus, a certain amount of overlapping is unavoidable because of the limitation in resolution with current photolithography technology. Another proposed method is directed to reducing the area of the active region of the SiGe HBT. Utilizing such a method would reduce the intrinsic component of the parasitic emitter-base junction capacitance, but as discussed briefly above, altering the device geometry would require altering the device fabrication process and can compromise the device's performance and reduce its effectiveness.

Thus, there is a need in the art for an emitter in a SiGe HBT that achieves a reduction in parasitic emitter to base capacitance without diminishing the performance of the SiGe HBT.

SUMMARY OF THE INVENTION

The present invention is directed to structure and method for a selective epitaxial HBT emitter. The present invention addresses and resolves the need in the art for an emitter in a SiGe HBT that achieves a reduction in parasitic emitter to base-capacitance without diminishing the performance of the SiGe HBT.

According to one exemplary embodiment, a heterojunction bipolar transistor comprises a base having a top surface. The heterojunction bipolar transistor, for example, may be an NPN silicon-germanium-carbon heterojunction bipolar transistor. The heterojunction bipolar transistor further comprises an epitaxial emitter selectively situated on the top surface of the base. For example, the epitaxial emitter may be N-type single-crystal silicon. The heterojunction bipolar transistor further comprises an etch stop layer situated on the top surface of the base, where the etch stop layer is in contact with the epitaxial emitter. The etch stop layer, for example, may be silicon dioxide.

According to this exemplary embodiment, the heterojunction bipolar transistor further comprises a first spacer and a second spacer situated on the etch stop layer, where the epitaxial emitter is situated between the first spacer and the second spacer. The first spacer and the second spacer, for example, may be LPCVD silicon nitride. The heterojunction bipolar transistor further comprises a dielectric layer deposited on the first and second spacers. For example, the dielectric layer may be silicon nitride. The heterojunction bipolar transistor further comprises an antireflective coating layer deposited over the dielectric layer. The antireflective coating layer, for example, may be silicon oxynitride. In another embodiment, the present invention is a method that achieves the above-described heterojunction bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for a selective epitaxial HBT emitter. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
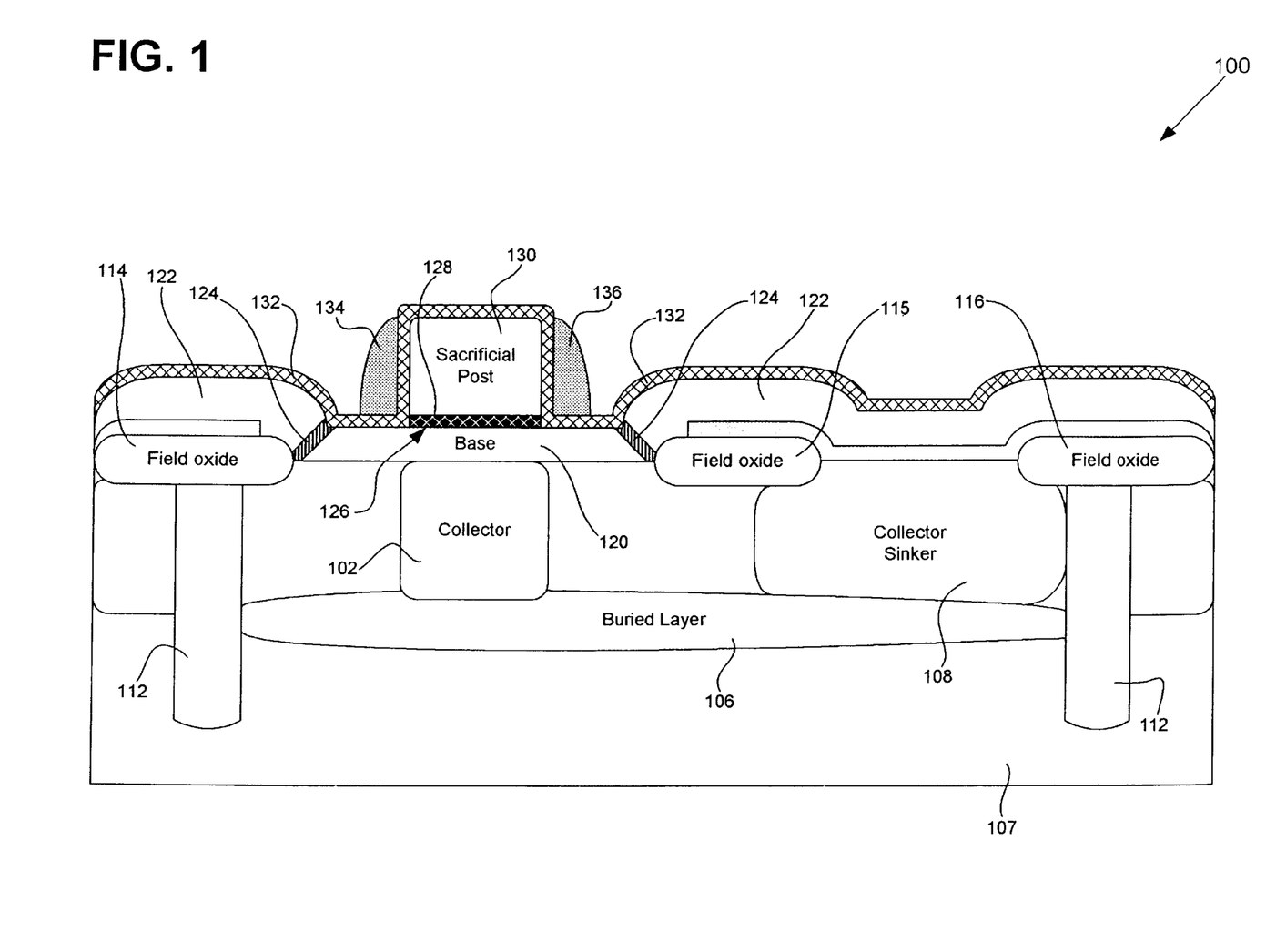
FIG. 1 illustrates a cross sectional view of the features of an exemplary NPN HBT prior to application of the steps taken to implement an embodiment of the present invention.

FIG. 1 shows a cross-sectional view of structure 100, which is utilized to describe one embodiment of the present invention. Certain details and features have been left out of FIG. 1 that are apparent to a person of ordinary skill in the art. Although structure 100 illustrates an exemplary NPN SiGe HBT, the present invention manifestly applies to other similar or related structures, such as PNP HBTs. Structure 100 includes collector 102 and base 120. Collector 102 is N-type single crystal silicon, which might be deposited epitaxially using a reduced pressure chemical vapor deposition ("RPCVD") process in a manner known in the art. Base 120 is a P-type SiGe single crystal that might be deposited epitaxially in an RPCVD process. In one embodiment, base 120 may be a P-type SiGe single crystal containing carbon, i.e. a SiGeC single crystal. As shown in FIG. 1, base 120 is situated on top of, and forms a junction with, collector 102. Base contact 122 is polycrystalline SiGe, which might be deposited epitaxially using a RPCVD process. Base 120 and base contact 122 connect with each other at interface 124 between the contact polycrystalline material and the base single crystal material. Base 120 has a top surface 126.

As seen in FIG. 1, base oxide layer 128 is formed on top surface 126 of base 120. For example, base oxide layer 128 can be a thin layer of silicon dioxide, which may have a thickness of approximately 50.0 Angstroms. Sacrificial post 130 is formed on base oxide layer 128, and can be polysilicon. Sacrificial post 130 will be removed prior to the formation of an epitaxial emitter by a selective deposition process described below. Etch stop layer 132 is formed over sacrificial post 130, base 120, and base contact 122. Etch stop layer 132 can be silicon dioxide, which may be deposited using a low pressure chemical vapor deposition ("LPCVD") process. However, the high deposition temperature of the LPCVD process can cause base dopant diffusion. For example, boron in the SiGe base, i.e. base 120, can diffuse and create a wider base dimension than is desired. In one embodiment, carbon may be added to the SiGe during the formation of base 120 to retard boron diffusion and thereby preserve the profile of base 120. In one embodiment, etch stop layer 132 may be a silicon dioxide layer deposited using a low temperature plasma enhanced chemical vapor deposition ("PECVD") process.

Also seen in FIG. 1, spacers 134 and 136 are formed on etch stop layer 132, and can comprise silicon nitride. In the present embodiment, spacers 134 and 136 can be formed by utilizing an anisotropic nitride etchant to etch back a conformal layer of silicon nitride, which can be deposited using an LPCVD process. Spacers 134 and 136 can comprise LPCVD silicon nitride, i.e. silicon nitride deposited using an LPCVD process. In one embodiment, spacers 134 and 136 may comprise silicon nitride deposited using a process other than LPCVD. The anisotropic nitride etchant is selective to silicon dioxide, and thus etch stop layer 132 provides an etch stop for the anisotropic nitride etchant. Spacers 134 and 136 can have a height of, for example, approximately 800.0 Angstroms. After spacers 134 and 136 have been formed, base contact 122 can be implanted with, for example, a boron implant in a manner known in the art. In one embodiment, etch stop layer 132 may be removed prior to the implant. In that embodiment, etch stop layer 132 must be redeposited prior to deposition of a dielectric layer, which occurs in a subsequent step in the formation of a selective epitaxial emitter described below.

As seen in FIG. 1, buried layer 106, which comprises N+ type material, i.e. heavily doped N-type material, is formed in silicon substrate 107 in a manner known in the art. Collector sinker 108, also composed of N+ type material, is formed by diffusion of heavily concentrated dopants from the surface of collector sinker 108 down to buried layer 106. Buried layer 106, along with collector sinker 108, provide a low resistance electrical pathway from collector 102 through buried layer 106 and collector sinker 108 to a collector contact (not shown in FIG. 1). Deep trench structures 112 and field oxide isolation regions 114, 115, and 116 provide electrical isolation from other devices on silicon substrate 107. Deep trench structures 112 and file oxide isolation regions 114, 115, and 116 might comprise, among other things, silicon oxide material and are formed in a manner known in the art. Thus FIG. 1 shows that structure 100 includes several features and components used to form an HBT at a stage prior to formation of an epitaxial emitter comprised of N-type single-crystal silicon.

Figure 2:
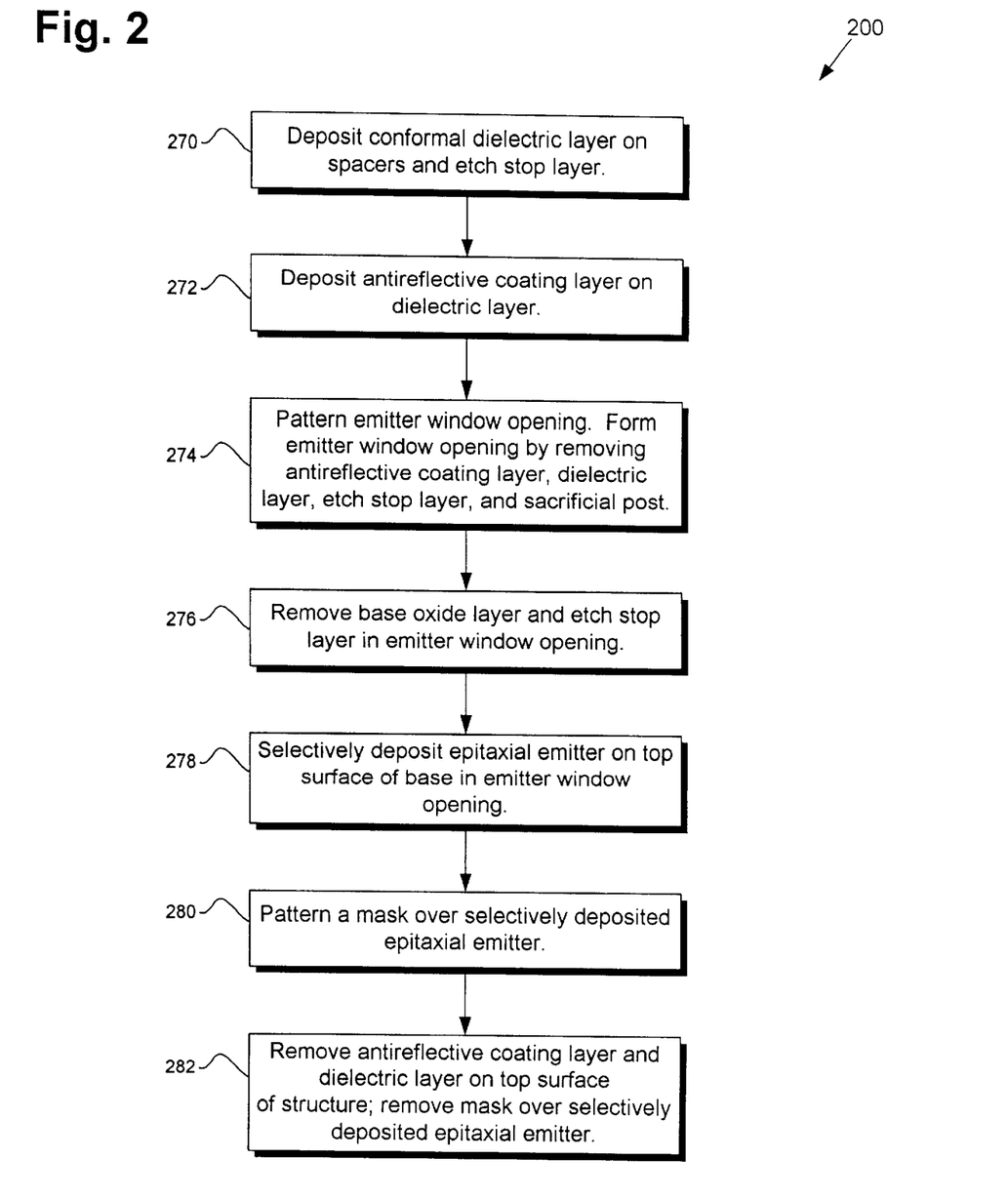
FIG. 2 shows a flowchart illustrating the steps taken to implement an embodiment of the present invention.

FIG. 2 shows flowchart 200, which describes the steps, according to one embodiment of the present invention, in processing a wafer that initially includes structure 100 of FIG. 1. Certain details and features have been left out of flowchart 200 which are apparent to a person of ordinary skill in the art, for example, a step may consist of one or more substeps or may involve specialized equipment, as known in the art.

Steps 270 through 284 indicated in flowchart 200 are sufficient to describe one embodiment of the present invention, other embodiments of the invention may use steps different from those shown in flowchart 200. It is noted that the processing steps shown in flowchart 200 are performed on a wafer that, prior to step 270, includes structure 100 shown in FIG. 1. In particular the wafer includes base oxide layer 128, sacrificial post 130, and etch stop layer 132, which will be etched to form an emitter window opening for an epitaxial emitter to be selectively deposited between spacers 134 and 136 on top surface 126 of base 120.

Figure 3A:
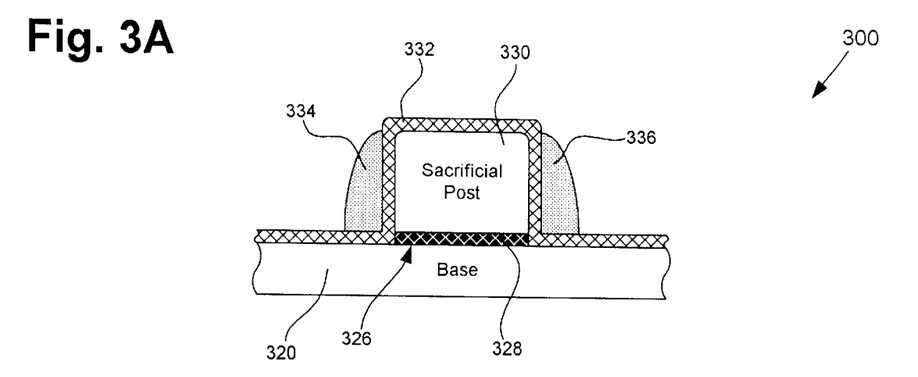
FIG. 3A illustrates a cross sectional view of an exemplary structure corresponding to a portion of the exemplary NPN HBT of FIG. 1 prior to performance of the steps shown in the flowchart of FIG. 2.

Referring now to FIG. 3A, structure 300 of FIG. 3A shows a portion of structure 100 of FIG. 1. Base 320, top surface 326, base oxide layer 328, sacrificial post 330, etch stop layer 332, and spacers 334 and 336 in structure 300 respectively correspond to base 120, top surface 126, base oxide layer 128, sacrificial post 130, etch stop layer 132, and spacers 134 and 136 in structure 100. For simplicity, other features such as base contact 122, interface 124, collector 102, buried layer 106, silicon substrate 107, collector sinker 108, deep trench structures 112, and field oxide isolation regions 114, 115, and 116 are not shown in structure 300. Thus, structure 300 shows a portion of structure 100 before processing step 270 of flowchart 200.

Referring to FIGS. 3B through 3H, each of structures 370, 372, 374, 376, 378, 380, and 382 of FIGS. 3B through 3H illustrates the result of performing, on structure 300, steps 270, 272, 274, 276, 278, 280, and 282, respectively, of flowchart 200 of FIG. 2. For example, structure 370 shows structure 300 after the processing of step 270; structure 372 shows structure 370 after the processing of step 272; and so forth.

Figure 3B:
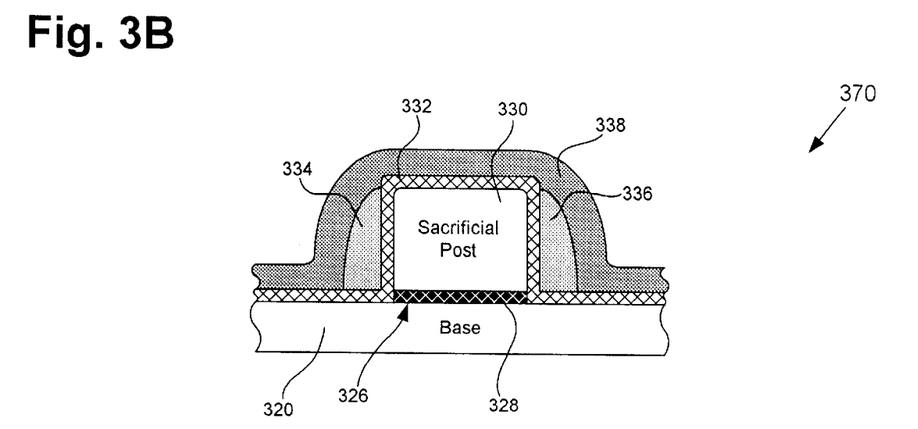
FIG. 3B illustrates a cross sectional view of an exemplary structure after performance of step 270 of FIG. 2, in accordance with one embodiment of the present invention.

Referring now to FIGS. 2 and 3B, in step 270 of flowchart 200 dielectric layer 338 is conformally deposited on spacers 334 and 336 and etch stop layer 332. Dielectric layer 338 can comprise silicon nitride and can have a thickness of approximately 200.0 to 300.0 Angstroms. Dielectric layer 338 may be deposited using, for example, either a low temperature RTCVD process or a higher temperature LPCVD process. Thus, structure 370 of FIG. 3B shows structure 300 of FIG. 3A after the conformal deposition of dielectric layer 338.

Figure 3C:
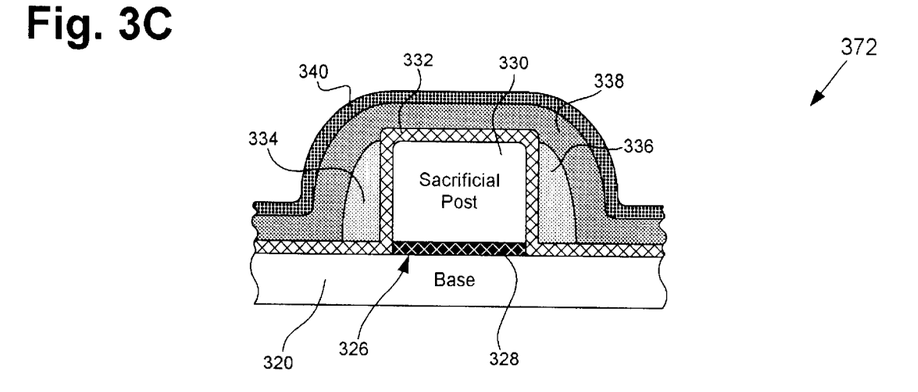
FIG. 3C illustrates a cross sectional view of an exemplary structure after performance of step 272 of FIG. 2, in accordance with one embodiment of the present invention.

Referring to FIG. 3C, the result of step 272 of flowchart 200 is illustrated by structure 372. In step 272, antireflective coating ("ARC") layer 340 is deposited on dielectric layer 338. The addition of ARC layer 340 provides a number of functions, for example, reduction of "subsurface reflection" which can degrade image definition of photoresist by exposing portions of photoresist not intended to be exposed. Thus, by reducing subsurface reflection, ARC layer 340 can improve the photo dimension properties of an emitter window opening which will be formed in a subsequent step of flowchart 200. In the present embodiment, ARC layer 340 can be silicon oxynitride, which is a dielectric. In another embodiment, a different type of antireflective coating may be used. Structure 372 of FIG. 3C, then, shows structure 370 of FIG. 3B after deposition of ARC layer 340 on dielectric layer 338.

Figure 3D:
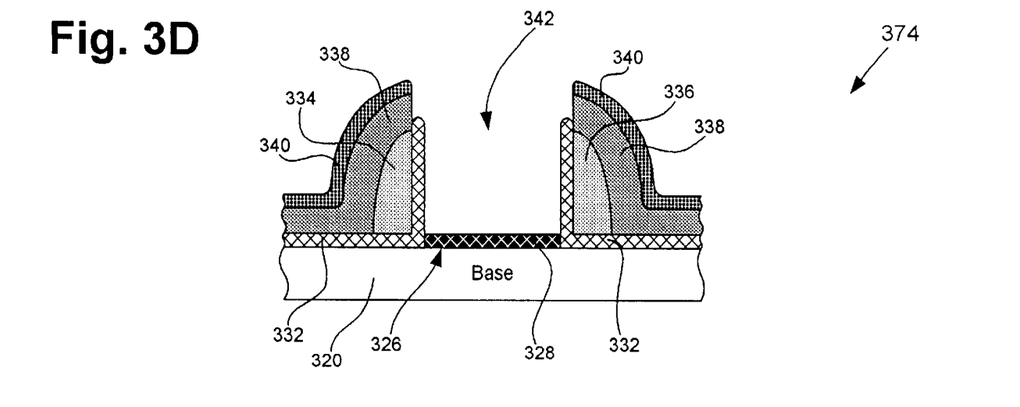
FIG. 3D illustrates a cross sectional view of an exemplary structure after performance of step 274 of FIG. 2, in accordance with one embodiment of the present invention.

Referring now to FIGS. 2 and 3D, in step 274 of flowchart 200 emitter window opening 342 is formed by patterning an emitter window on ARC layer 340 and etching ARC layer 340, dielectric layer 338, etch stop layer. 332, and sacrificial post 330. For example, the emitter window may be patterned using photoresist. However, other methods of patterning could be used as known by a person of ordinary skill in the art. ARC layer 340, dielectric layer 338, etch stop layer 332, and sacrificial post 330 may be etch using suitable etchants as is known in the art. For example, etchants that could be used include $CF_4$ and chlorine compounds known in the art. Referring to FIG. 3D, the result of patterning an emitter window and etching ARC layer 340, dielectric layer 338, etch stop layer 332, and sacrificial post 330 to form emitter window opening 342 is illustrated by structure 374.

Figure 3E:
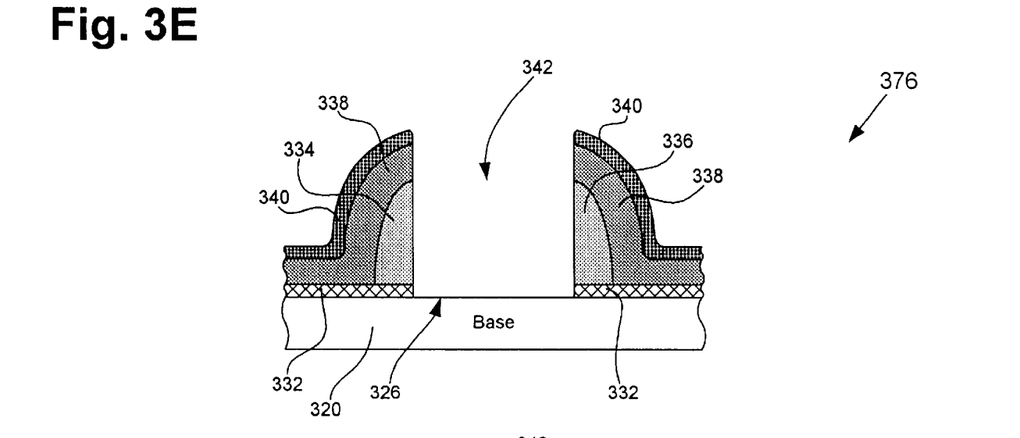
FIG. 3E illustrates a cross sectional view of an exemplary structure after performance of step 276 of FIG. 2, in accordance with one embodiment of the present invention.

Referring now to FIGS. 2 and 3E, in step 276 of flowchart 200 base oxide layer 328 and etch stop layer 332 on side walls of emitter window opening 342 are removed to expose spacers 334 and 336 and top surface 326 of base 320. Base oxide layer 328 and etch stop layer 332 on side walls of emitter window opening 342 are removed to allow an epitaxial emitter to be selectively deposited on top surface 326 of base 320. Removal of base oxide layer 328 exposes silicon on top surface 326 of base 320. Accordingly, the exposed silicon on top surface 326 of base 320 provides a site for selective deposition of an epitaxial emitter.

Continuing with step 276 of flowchart 200, removal of base oxide layer 328 and etch stop layer 332 can be accomplished, for example, using an etchant such as hydrogen fluouide ("HF"). HF is selective to silicon oxynitride in ARC layer 340 and silicon nitride in dielectric layer 338 and spacers 334 and 336, and thus HF will cause only a minimal erosion of ARC layer 340, dielectric layer 338, and spacers 334 and 336. Additionally, use of LPCVD silicon nitride for spacers 334 and 336 in the present embodiment is particularly advantageous since LPCVD nitride exhibits very high resistant to HF. Referring to FIG. 3E, the result of removing base oxide layer 328 and etch stop layer 332 on side walls of emitter window opening 342 in step 276 of flowchart 200 is illustrated by structure 376.

Figure 3F:
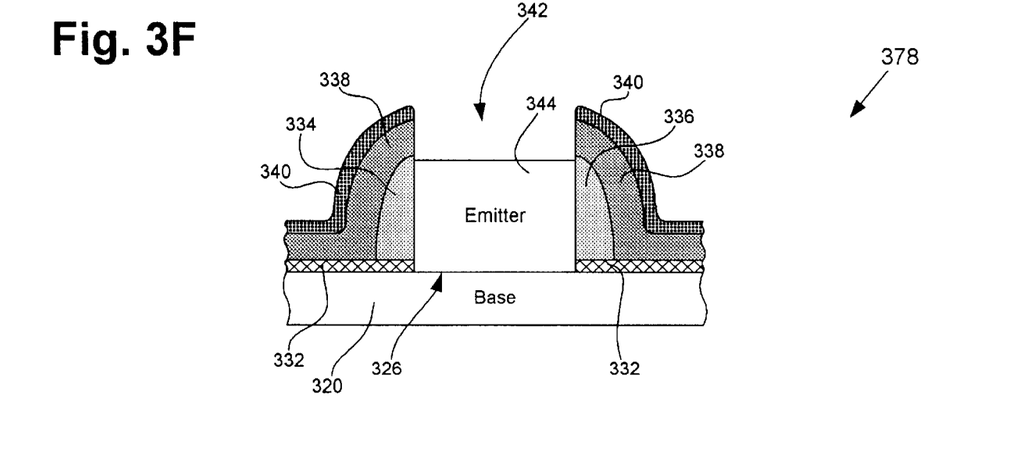
FIG. 3F illustrates a cross sectional view of an exemplary structure after performance of step 278 of FIG. 2, in accordance with one embodiment of the present invention.

Referring now to FIGS. 2 and 3F, in step 278 emitter 344 is formed by a selective silicon deposition process on top surface 326 of base 320 in emitter window opening 342. Emitter 344 can comprise N-type single-crystal silicon, which may be deposited in a selective LPCVD process. In one embodiment, emitter 344 may be N-type single-crystal silicon deposited in a selective RTCVD process. In the above selective silicon deposition process, emitter 344 is only formed in the area where silicon is exposed, i.e. on top surface 326 of base 320 in emitter window opening 342. Thus, the selective silicon deposition process is selective to, i.e. will not deposit silicon on, dielectric surfaces comprising silicon nitride, i.e. spacers 334 and 336 and dielectric layer 338, or dielectric surfaces comprising silicon oxynitride, i.e. ARC layer 340. The selective silicon deposition process is also selective to silicon dioxide, and thus silicon will not be deposited on any exposed surface comprising silicon dioxide, such as etch stop layer 332.

By way of background, the particular process chemistry used for epitaxial deposition of silicon determines the thickness of silicon deposited on different materials as a function of time. Although the silicon deposition rate may be similar for different materials once a seed layer is formed, each material typically requires a different amount of time, i.e. an incubation time, to form the seed layer and begin nucleating. For example, for silicon deposition the incubation time required to form a seed layer on silicon nitride or silicon dioxide is greater than the incubation time required to form a seed layer on silicon. As a result, during epitaxial silicon deposition, a certain thickness of silicon may form on a silicon surface prior to silicon nucleating on a silicon nitride, silicon oxynitride, or silicon dioxide surface.

The difference between the time required to form a seed layer, or nucleate, on silicon nitride and the time required to form a seed layer on silicon, i.e. the "incubation window," is determined, among other things, by pressure, gas flow, and the chemistries used in the selective epitaxial emitter process. Thus, in the present invention, the selective epitaxial emitter process can be engineered to widen the incubation window to achieve a desired thickness for emitter 344 on top surface 326 of base 320 without nucleating any silicon on silicon nitride, i.e. on spacers 334 and 336 and dielectric layer 338 or on silicon oxynitride, i.e. ARC layer 340, or on any exposed silicon dioxide surface. Referring to FIG. 3F, the result of selectively depositing an epitaxial emitter. i.e. emitter 344, in step 278 of flowchart 200 is illustrated by structure 378.

Thus, by forming structure 376 in FIG. 3E which includes exposed silicon nitride, i.e. dielectric layer 338 and spacers 334 and 336, and exposed silicon oxynitride, i.e. ARC layer 340 in emitter window opening 342, the present invention provides a structure that allows an epitaxial emitter to be deposited only on top surface 326 of base 320. In contrast, in a conventional SiGe HBT emitter fabrication process, where a layer of polysilicon or amorphous silicon is utilized, a selective epitaxial emitter process cannot be used because deposited silicon would nucleate on any exposed edges or surfaces containing polysilicon or amorphous silicon. As a result, deposited silicon could nucleate on areas outside the emitter window opening, or deposited silicon could cause a bridge to form in the emitter window opening and thereby prevent proper formation of the emitter.

Figure 3G:
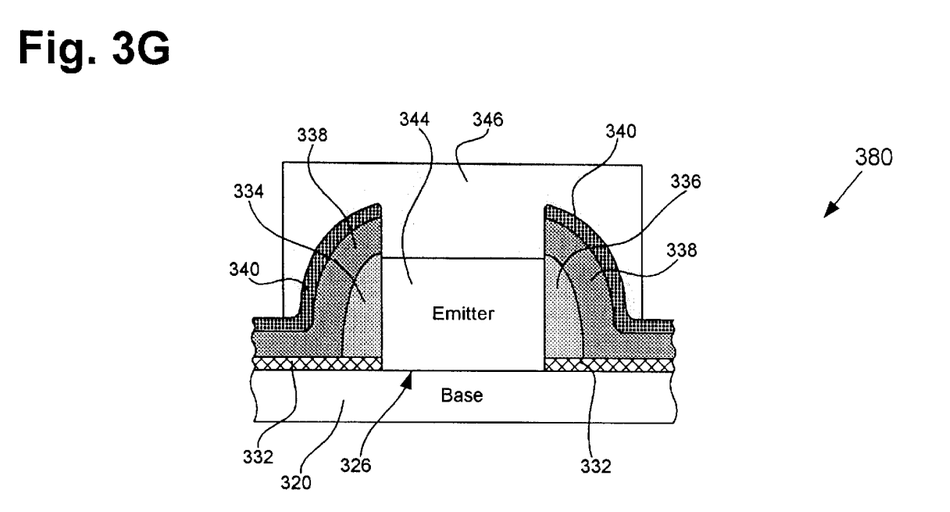
FIG. 3G illustrates a cross sectional view of an exemplary structure after performance of step 280 of FIG. 2, in accordance with one embodiment of the present invention.

Referring now to FIGS. 2 and 3G, in step 280 of flowchart 200 mask 346 is patterned over emitter 344. Mask 346 may be photoresist, which may be patterned in a manner known in the art. However, mask 346 may comprise other suitable materials as is known by a person of ordinary skill in the art. Referring to FIG. 3G, the result of patterning mask 346 over emitter 344 in step 280 of flowchart 200 is illustrated by structure 380.

Figure 3H:
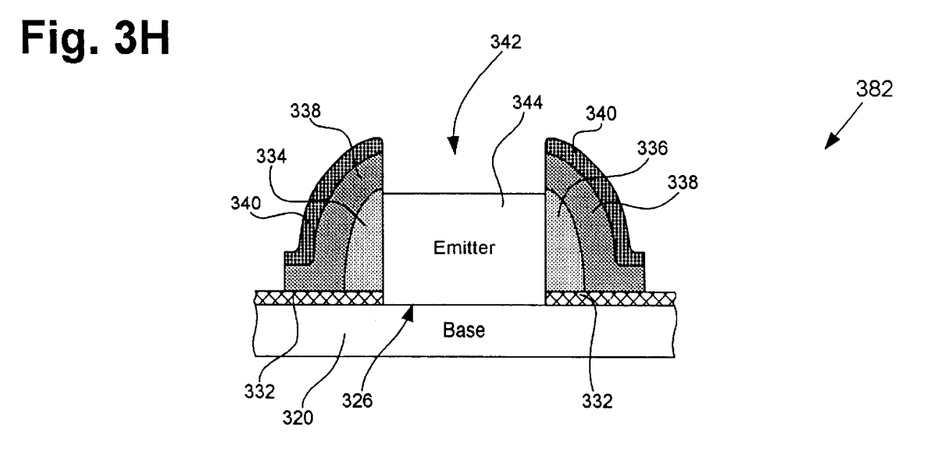
FIG. 3H illustrates a cross sectional view of an exemplary structure after performance of step 282 of FIG. 2, in accordance with one embodiment of the present invention.

Referring now to FIGS. 2 and 3H, in step 282 ARC layer 340 and dielectric layer 338 are removed from areas of the wafer not covered by mask 346. After removal of ARC layer 340 and dielectric layer 338, mask 346 is also removed. ARC layer 340 and dielectric layer 338, may be removed by suitable etchants known in the art which are selective to underlying etch stop layer 332. Thus, as a result of removing ARC layer 340 and dielectric layer 338, etch stop layer 332 remains on the surface of the wafer. Mask 346 can be removed in a manner known by a person of ordinary skill in the art. Referring to FIG. 3H, the result of removing ARC layer 340, dielectric layer 338, and mask 346 in step 282 of flowchart 200 is illustrated by structure 382.

Thus, by providing a structure that utilizes dielectric layer 338 to replace a conventional layer comprising polysilicon or amorphous silicon, and also utilizing ARC layer 340 and spacers 334 and 336, the present invention allows an epitaxial emitter, i.e. emitter 344, to be selectively deposited on top surface 326 of a SiGe base. i.e. base 320, in emitter window opening 342. By epitaxially depositing emitter 344 in emitter window opening 342, the present invention advantageously reduces parasitic emitter to base capacitance.

By way of background, the parasitic emitter to base capacitance includes two components, a parasitic emitter to intrinsic base junction capacitance and a parasitic emitter to extrinsic base capacitance. In a conventional SiGe HBT emitter composed of polycrystalline silicon, portions of the polycrystalline silicon emitter extend beyond the active area of the SiGe HBT. The above portions the conventional polycrystalline silicon emitter that extend beyond the active area are situated above the extrinsic base region of the SiGe HBT, and thus create parasitic emitter to extrinsic base capacitance.

In contrast to a conventional polycrystalline silicon emitter, the present invention's selectively deposited epitaxial emitter does not extend beyond the active area of a SiGe HBT. As a result, the present invention's selectively deposited epitaxial emitter eliminates the parasitic emitter to extrinsic base capacitance in the SiGe HBT, and thus achieves a reduction in parasitic emitter to base capacitance.

Also, the present invention provides an epitaxial emitter that comprises N-type single-crystal silicon. By way of background, single-crystal silicon provides lower resistance to current flow than polycrystalline silicon. Thus, the present invention, by providing an epitaxial emitter comprising N-type single-crystal silicon, advantageously achieves a SiGe HBT with lower emitter resistance than a SiGe HBT comprising a conventional polycrystalline silicon emitter.

Thus, the present invention, by providing a selectively deposited epitaxial emitter, achieves a SiGe HBT having reduced parasitic emitter to base capacitance and decrease emitter resistance. As such, the present invention provides a SiGe HBT that achieves higher performance than a conventional SiGe HBT having a polycrystalline silicon emitter.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, the principles of the present invention are also applicable to NPN HBTs using semiconductors other than silicon or germanium. Further, the present invention's principles can also be applied to PNP SiGe HBTs or to non-SiGe PNP HBTs. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, structure and method for a selective epitaxial HBT emitter have been described.

What is claimed is:

1. A method for fabricating a heterojunction bipolar transistor, said method comprising steps of:

fabricating a first spacer and a second spacer on a base of said heterojunction bipolar transistor, said first and second spacers defining an emitter window opening of said heterojunction bipolar transistor, wherein a base oxide layer is situated on said base in said emitter window opening;

depositing a dielectric layer on said first spacer and said second spacer;

removing said base oxide layer in said emitter window opening to expose a top surface of said base after said step of depositing;

selectively depositing an epitaxial emitter on said top surface of said base, said epitaxial emitter being deposited between said first spacer and said second spacer and in said emitter window opening.

2. The method of claim 1 further a step of depositing an etch stop layer on said base of said heterojunction bipolar transistor before said fabricating step.

3. The method of claim 2 wherein said etch stop layer comprises silicon dioxide.

4. The method of claim 1 further comprising a step of depositing an antireflective coating layer on said dielectric layer after said depositing step.

5. The method of claim 4 wherein said antireflective coating layer comprises silicon oxynitride.

6. The method of claim 1 wherein said first spacer and said second spacer comprise LPCVD silicon nitride.

7. The method of claim 1 wherein said dielectric layer comprises silicon nitride.

8. The method of claim 1 wherein said epitaxial emitter comprises N-type single-crystal silicon.

9. The method of claim 1 wherein said heterojunction bipolar transistor is an NPN silicon-germanium-carbon heterojunction bipolar transistor.

10. A method for fabricating a heterojunction bipolar transistor, said method comprising steps of:

fabricating a first spacer and a second spacer on a base of said heterojunction bipolar transistor, said first and second spacers defining an emitter window opening of said heterojunction bipolar transistor, wherein a base oxide layer is situated on said base in said emitter window opening;

depositing a dielectric layer on said first spacer and said second spacer;

depositing an antireflective coating layer on said dielectric layer;

removing said base oxide layer in said emitter window opening to expose a top surface of said base after said steps of depositing;

selectively depositing an epitaxial emitter on said top surface of said base, said epitaxial emitter being deposited between said first spacer and said second spacer and in said emitter window opening.

11. The method of claim 10 wherein said antireflective coating layer comprises silicon oxynitride.

* * * * *